United States Patent
Delshadpour et al.

(10) Patent No.: US 10,691,150 B1
(45) Date of Patent: Jun. 23, 2020

(54) FAST RESPONSE HIGH-SPEED REDRIVER CHANNEL POWER UP IN CIO MODE

(71) Applicant: NXP B.V., Eindhoven (NL)

(72) Inventors: Siamak Delshadpour, Phoenix, AZ (US); Soon-Gil Jung, Cupertino, CA (US)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 16/396,452

(22) Filed: Apr. 26, 2019

(51) Int. Cl.
 *H04B 3/36* (2006.01)
 *G05F 1/56* (2006.01)
 *H03K 19/08* (2006.01)
 *H04L 25/20* (2006.01)

(52) U.S. Cl.
 CPC .............. *G05F 1/56* (2013.01); *H03K 19/08* (2013.01); *H04B 3/36* (2013.01); *H04L 25/20* (2013.01)

(58) Field of Classification Search
 CPC ..... H04L 25/245; H04L 25/24; H04L 25/242; H04B 3/36; G05F 1/56; H03K 19/08
 See application file for complete search history.

(56) References Cited

U.S. PATENT DOCUMENTS

| | | | |
|---|---|---|---|
| 7,397,226 B1 | 7/2008 | Mannama et al. | |
| 2004/0169562 A1* | 9/2004 | Novac | H03B 5/06 331/158 |
| 2010/0091921 A1* | 4/2010 | Den Besten | H03L 7/189 375/354 |
| 2011/0274290 A1 | 11/2011 | Holzmann et al. | |
| 2013/0195291 A1 | 8/2013 | Josefsson | |
| 2013/0316671 A1* | 11/2013 | Stockinger | H04B 1/18 455/341 |
| 2014/0006826 A1* | 1/2014 | Wagh | G06F 13/4282 713/323 |
| 2015/0227489 A1* | 8/2015 | Chen | G06F 13/385 710/313 |
| 2017/0310398 A1* | 10/2017 | Masuda | G06F 13/36 |
| 2019/0042281 A1* | 2/2019 | Raghav | G06F 9/44505 |
| 2019/0086994 A1* | 3/2019 | Regupathy | G06F 1/3296 |
| 2019/0288743 A1* | 9/2019 | Wang | H04L 25/24 |
| 2019/0386853 A1* | 12/2019 | Khan | H04L 5/14 |

* cited by examiner

*Primary Examiner* — Harry R Behm

(57) ABSTRACT

A redriver powers up a high-speed channel within a time window sufficient to satisfy the requirements of a CIO mode of operation. The redriver includes a signal detector for a channel and control logic to activate the channel within a time window that satisfies operation in a CIO mode. The control logic may activate the channel by controlling a first bias current for a first circuit of the channel based on a signal detected by the signal detector. The first bias current may be greater than a second bias current for the first circuit during a mode different from the CIO mode. These features may form any linear or limiting redriver for a faster power-up time.

19 Claims, 7 Drawing Sheets

FAST RESPONSE HIGH-SPEED REDRIVER CHANNEL POWER UP IN CIO MODE

TECHNICAL FIELD

Example embodiments disclosed herein relate generally to controlling a circuit

BACKGROUND

The integrity of signals travelling through a cable or the traces of a printed circuit board may degrade because of loss and inter-symbol interference, especially at relatively higher frequencies. A redriver may be used to solve this problem. A redriver applies equalization to compensate for channel loss and outputs signals with a high differential voltage. This may allow longer cables to be used and may promote compliance with applicable protocols and cable/connector standards.

A redriver may operate in one or more power saving modes. In these modes (which may be for a long period of time), specifications often require current to be low. This is especially the case for a linear redriver. In order to realize low current, the high speed channel(s) of the redriver may be turned off during signal detection mode.

When a low frequency periodic signal (LFPS) is detected, the high speed channel(s) of the redriver may have only a short window of time (e.g., 40 nS) to be powered-up. However, the power-up time of the high speed channel(s) may be considerably longer (e.g., greater than 100 ns or even a few hundred ns) because of the large size (e.g., heavy parasitic loading) of the channel bias nodes. The inability of the high speed channels to "wake up" in the short period of time required for converged input/output (CIO) mode operation. This may cause performance issues or may otherwise limit operation of the redriver and its host system.

SUMMARY

A brief summary of various example embodiments is presented below. Some simplifications and omissions may be made in the following summary, which is intended to highlight and introduce some aspects of the various example embodiments, but not to limit the scope of the invention. Detailed descriptions of example embodiments adequate to allow those of ordinary skill in the art to make and use the inventive concepts will follow in later sections.

Example embodiments include a redriver which includes a signal detector for a channel and control logic configured to activate the channel within a time window that satisfies operation in a CIO mode, the control logic configured to activate the channel by controlling a first bias current for a first circuit of the channel based on a signal detected by the signal detector, wherein the first bias current is greater than a second bias current for the first circuit during a mode different from the CIO mode. The signal may include a plurality of low frequency periodic signaling (LFPS) pulses, and the time window for activation of the channel is equal to or less than a duration of N output LFPS pulses. In one case, N≤3.

The control logic may disable application of the first bias current to the first circuit after the time window, and control application of the second bias current to the first circuit during the mode different from the CIO mode. The control logic may include the signal detector, and the signal detector may output a signal to control application of the first bias current independent from a controller that controls the second bias current to the first circuit during the mode different from the CIO mode.

The control logic may output a signal to enable at least one second circuit of the channel within the time window that satisfies operation in the CIO mode. The at least one second circuit may be selected from a group consisting of a receiver circuit, an equalizer circuit, and a pre-driver circuit. The control logic may include the signal detector, and the signal detector may output the signal to enable the at least one second circuit of the channel independent from a controller configured to enable the at least one second circuit during the mode different from the CIO mode. The first circuit may include a transmitter driver circuit and channel may be a high-speed channel that conforms to USB-C protocol.

In accordance with one or more embodiments, a method for controlling a redriver includes detecting a signal on a channel of the redriver; and activating the channel within a time window that satisfies operation in a CIO mode, wherein activating the channel includes controlling a first bias current for a first circuit of the channel based on the detected signal, and wherein the first bias current is greater than a second bias current applied to the first circuit during a mode different from the CIO mode. The signal may include a plurality of low frequency periodic signaling (LFPS) pulses, and the time window for activation of the channel is equal to or less than a duration of N output LFPS pulses. In one case, N≤3.

The method may include disabling application of the first bias current to the first circuit after the time window and controlling application of the second bias current to the first circuit during the mode different from the CIO mode. Controlling the first bias current may include controlling application of the first bias current independent from a controller that controls the second bias current to the first circuit during the mode different from the CIO mode. The method may include enabling at least one second circuit of the channel within the time window that satisfies operation in the CIO mode. The at least one second circuit may be selected from a group consisting of a receiver circuit, an equalizer circuit, and a pre-driver circuit.

The method may include enabling the at least one second circuit of the channel independent from a controller configured to enable the at least one second circuit during the mode different from the CIO mode. The first circuit may include a transmitter driver circuit. The channel may be a high-speed channel that conforms to USB-C protocol.

BRIEF DESCRIPTION OF THE DRAWINGS

Additional objects and features of the invention will be more readily apparent from the following detailed description and appended claims when taken in conjunction with the drawings. Although several example embodiments are illustrated and described, like reference numerals identify like parts in each of the figures, in which:

DETAILED DESCRIPTION

Figure 1:
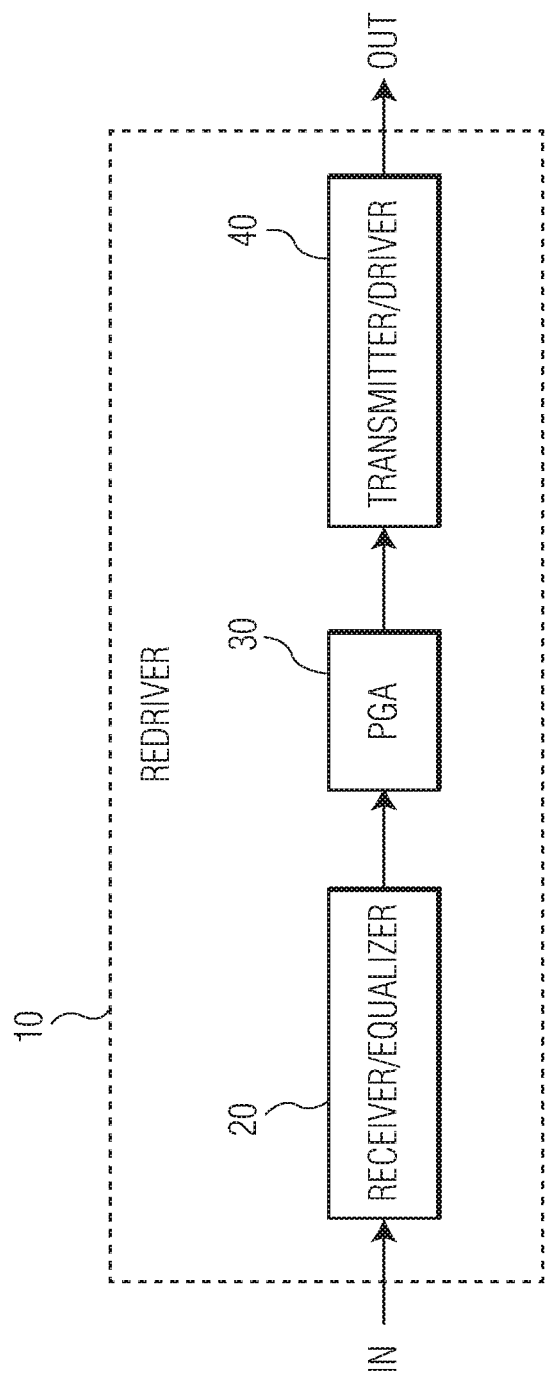
FIG. 1 illustrates an example of the channel circuits of a linear redriver.

It should be understood that the figures are merely schematic and are not drawn to scale. It should also be understood that the same reference numerals are used throughout the figures to indicate the same or similar parts.

The descriptions and drawings illustrate the principles of various example embodiments. It will thus be appreciated that those skilled in the art will be able to devise various arrangements that, although not explicitly described or shown herein, embody the principles of the invention and are included within its scope. Furthermore, all examples recited herein are principally intended expressly to be for pedagogical purposes to aid the reader in understanding the principles of the invention and the concepts contributed by the inventor(s) to furthering the art and are to be construed as being without limitation to such specifically recited examples and conditions. Additionally, the term, "or," as used herein, refers to a non-exclusive or (i.e., and/or), unless otherwise indicated (e.g., "or else" or "or in the alternative"). Also, the various example embodiments described herein are not necessarily mutually exclusive, as some example embodiments can be combined with one or more other example embodiments to form new example embodiments. Descriptors such as "first," "second," "third," etc., are not meant to limit the order of elements discussed, are used to distinguish one element from the next, and are generally interchangeable. Values such as maximum or minimum may be predetermined and set to different values based on the application.

In order to save power in a redriver functional mode, a termination resistor (50 ohm) may be detected at the transmitter (TX) output (line termination) using a receiver (RX) detection circuit, e.g., far-end termination detection. After the far-end termination resistor is detected at the TX driver output, the signal detector at the RX side will be turned on to detect an incoming signal. Before detection of an incoming signal, the high-speed channel of the redriver may be turned off in order to support a power saving mode.

After detection of an incoming signal, the high-speed channel will be powered up (or enabled). The time to power up the high-speed channel in current redrivers may be in a range of over 100 ns to a few hundred nanoseconds (ns), which usually is not an issue when operating, for example, in USB mode due to an increased number of LFPS pulses.

However, newer CIO standards are different, requiring consumption of only 3 out of a series of LFPS pulses (e.g., 15) for a chain of redrivers. Thus, for newer CIO standards, the power-up time for the high-speed channel is inadequate. For example, for newer CIO standards, 3*20 nS=60 nS is required for a 50 MHz LFPS signal. Thus, detection of an LFPS pulse and power (or start) up of the high-speed channel should happen in less than 60 nS in order to prevent any degradation in performance of the high-speed channel (including channel stability) for all the bias lines. These timing requirements are not achievable using current redrivers.

Example embodiments describe a redriver which includes control logic for powering up at least one channel within a time window that satisfies the requirements of a CIO mode. In one embodiment, the controller generates one or more signals to enable, bias, and power channel circuits based on detection of a limited number of pulses received on the channel during start up. In one embodiment, the redriver includes a signal detector to detect pulses at the receiver side of the channel. When the pulses are detected, the controller may output signal(s) to enable and bias the channel circuits. The bias may be performed based on a boosted bias voltage that increases the rate at which power-up of the channel occurs, thereby satisfying time window requirements in CIO mode. The channel may be, for example, a high-speed channel associated with the protocol of a USB-C interface or another protocol/interface and the pulses may be LFPS pulses.

FIG. 1 illustrates an example of a linear redriver 10 which includes a channel for transferring data between a host system and a device. The linear redriver includes a receiver circuit 20, a programmable gain amplifier (PGA) 30, and a transmitter circuit 40. The receiver circuit 20 may perform an equalization operation to shape an incoming signal to conform to an applicable standard or protocol. The equalization may be fixed or may be values programmed or otherwise controlled by a controller of the redriver, for example, based on operational mode. The equalization and gain may compensate for distortion and losses experienced by the signals traveling through the cable.

The PGA 30 may compensate for process-voltage-temperature (PVT) variations in the signal output from the receiver circuit. For example, the PGA may compensate for these variations by applying one or more levels of gain to the receiver output.

The transmitter 40 may apply a gain to drive the signal output from the receiver.

Figure 2:
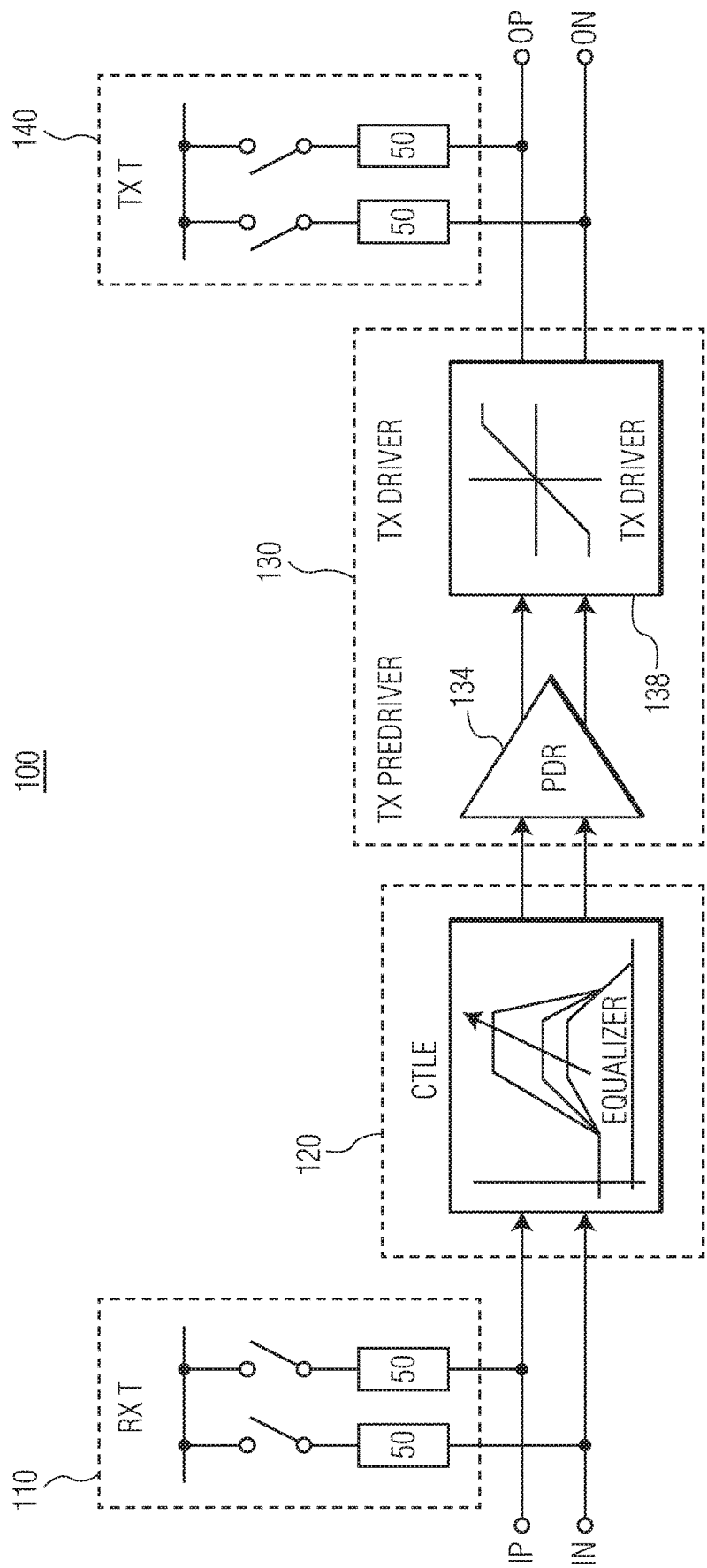
FIG. 2 illustrates another example of the channel circuits of a linear redriver.

FIG. 2 illustrates another example of a linear redriver 100 operating in one or more functional and power saving modes. The redriver 100 includes a channel for transferring data between a host and a device connected through a cable, which, for example, may be USB-C cable. The redriver chip may include at least one high-speed channel, which may be unidirectional or bidirectional. In one embodiment, one or more low-speed channels may also be included.

Referring to FIG. 2, the linear redriver 100 includes a receiver circuit 110, an equalizer 120, a predriver circuit 130, and a transmitter circuit 140 for each channel. In this example, the receiver circuit 110 includes two (50 ohm) termination resistors 115 connected to respective lines of a differential input signal (IN, IP). The equalizer 120 performs continuous time linear equalization to shape the signal output from the receiver circuit. The driver circuit 130 includes buffer (or pre-driver, PDR) 134 and a driver 138. The PDR shifts the voltage levels of the signal output from the equalizer in order to drive transistors in the driver 138. The driver 138 then shapes the output of the PDR to conform to a predetermined protocol or standard. The transmitter circuit includes matching (50 ohm) termination resistors coupled to a differential output line. In redriver 100, the PGA stage included in the redriver of FIG. 1 is omitted.

Figure 3:
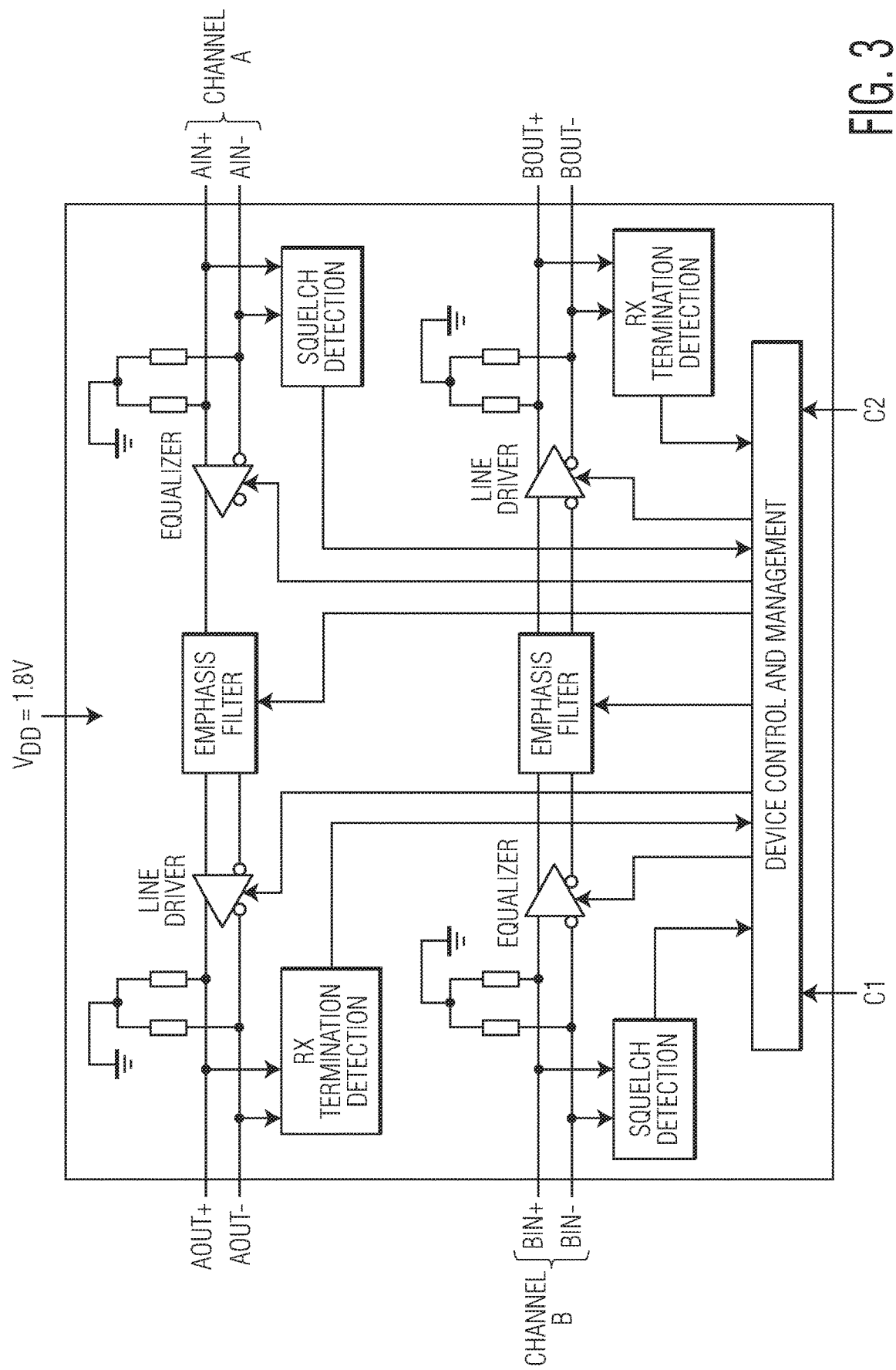
FIG. 3 illustrates an example of a lane in a redriver with bi-directional channels.

FIG. 3 illustrates an example of two channels A and B forming one lane in a redriver, which, for example, may be the redriver of FIG. 2. Each channel in the lane carries data in a different direction, so that together the channels form a bidirectional lane. In this implementation, each channel includes a detection circuit on the transmitter and receiver sides to detect, for example, connection of a cable and signals relating to other functions or modes of operation. In another embodiment, only one signal detector may be included at one of the transmitter or receiver sides of each channel. The same or duplicate circuits in FIG. 2 may be provided for each channel when the redriver includes multiple lanes. (In one embodiment, use of an emphasis filter may make the redriver a limiting redriver, but an emphasis filter may not be needed for a linear redriver. For example, the emphasis filter may be replaced with a programmable gain amplifier (PGA) or a predriver for a linear redriver case).

In addition to the foregoing features, the redriver may include one or more bias circuits for the circuits (RX, TX, etc.) of each channel. These bias circuits tend to be relatively large as a result of the significant amount of current consumed by the signal paths of the high-speed channels and the cascaded connection of current digital-to-analog converters (IDACs) provided for controlling and trimming the DC voltage level of the TX driver output. Together, these features may form large parasitic capacitors. Charging the parasitic capacitors to an acceptable bias voltage tends to be a slow process. As a result, the power-up time for the high-speed channel(s) tend to be slow, taking far longer than the less than 100 ns (e.g., 40 or 60 ns) indicated for newer CIO standards.

Figure 4:
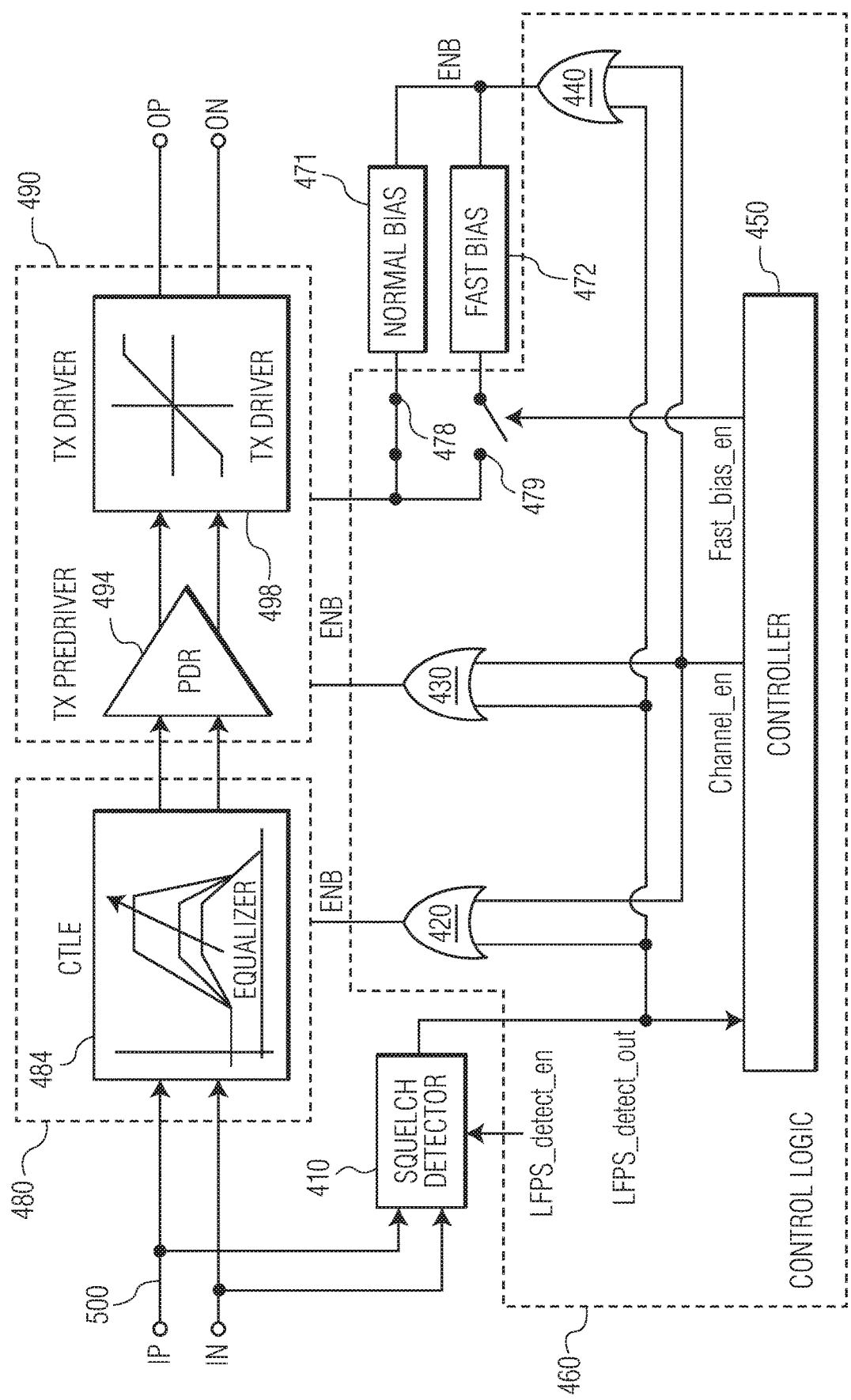
FIG. 4 illustrates an embodiment of a redriver including fast (e.g., CIO) mode control logic.

FIG. 4 illustrates an embodiment of a redriver 400 which includes one or more channels that may be coupled to a cable (or other interface) used to transfer data between a host system and a device. The redriver may apply equalization and/or perform other signal processing to compensate for signal loss in the channels. Use of a redriver (e.g., in the host system) may allow longer cables to be used and may promote compliance with applicable protocols and cable/connector standards. The cable (or interface) may conform to a predetermined protocol or standard. One example is the USB-C protocol, however the redriver may conform to a different protocol in another embodiment.

Referring to FIG. 4, the redriver includes control logic 460 for controlling the channels. For purposes of illustration, only one channel 500 is illustrated. Channel 500 may include many of the same circuits illustrated in the redriver of FIG. 2, including a receiver circuit 480 and a transmitter circuit 490. The receiver circuit 480 may include an equalizer 484 to perform continuous time linear equalization to shape the signal output from the receiver circuit. The transmitter 490 may include a pre-driver 494 and a driver 498. The pre-driver may shift the voltage levels of the signal output from the equalizer in order to drive transistors in the driver 498. The driver 498 then shapes the output of the pre-driver to conform to a predetermined protocol or standard. As will be explained in greater detail below, the pre-driver 494 and/or the driver 498 of the transmitter may operate based on one or more bias voltages, depending on the mode of operation of the redriver.

The control logic 460 includes a plurality of logic gates 420, 430, and 440, and a controller 450. The signal detector 410 detects signals received by the receiver circuit 480 on an input line of the channel, which, for example, may be a differential input line IP, IN. Various types of signals may be received on the differential input line in different modes of operation of the redriver. These modes may include various functional modes and various power saving modes. For purposes of the present embodiment, the signal detector may detect LFPS signals during a power-up (or start-up) mode. The signal detector 410 may be enabled by an LFPS_Detect_En signal output, for example, from a controller, described in greater detail below.

In one embodiment, the signal detector 410 may be a squelch detector. During normal mode (e.g., a mode different from start-up), the squelch detector monitors the power level of signals on the channel and generates a signal to power down unused circuits (e.g., the channel circuits) when the signal drops below a predetermined level. In the present embodiment, the squelch detector outputs a control signal for controlling the application of a bias voltage to one or more transmitter circuits (e.g., the pre-drier 494, the driver 498, or both) associated with the channel 500 and/or for enabling other channel circuits to satisfy CIO mode time window requirements.

The plurality of logic gates 420, 430, and 440 generate control signals for enabling and/or applying the bias voltage to the channel circuits based on the output of the signal detector 410, e.g., when the signal detector detects LFPS signals and generates a control signal LFPS_Detect_Out during power-up or a power saving state in CIO mode. The logic gates may include the same logic or may be different from one another. In the example illustrated in FIG. 4, the logic gates are all OR gates.

The OR gate 420 receives the LFPS control signal and a channel enable signal Channel-en as inputs, and outputs an enable signal Enb to activate (or "wake up") the channel equalizer 484.

The OR gate 430 receives the LFPS control signal and the channel enable signal Channel-En as inputs, and outputs an enable signal Enb to activate (or "wake up") the pre-driver 494 and driver 498 of the transmitter circuit.

The OR gate 440 receives the LFPS control signal and the channel enable signal Channel-En as inputs, and outputs an enable signal Enb to activate (or "wake up") a circuit which applies one of a first bias current 471 or a second bias current to the pre-driver and/or driver of the transmitter circuit 490. The first bias current 471 may be applied as the only current to bias the transmitter circuits during a mode of operation different from CIO mode, e.g., normal mode. The second bias current may include a sum of the first bias current 471 and a boost current 472, e.g., labeled fast bias in FIG. 4. The increased level of the second bias current relative to the first bias current 471 increases the overall bias current for the biasing part of the transmitter circuit during CIO mode. The increased overall bias current, boosted by current 472, increases the rate for charging a parasitic capacitor associated with the channel transmitter, which, in turn, helps the channel to be powered up in a much shorter period of time. In this case, the size of the boost current may be selected to power-up the channel at a rate sufficiently fast to occur within the time window of the CIO mode, thereby preventing signal quality degradation and overall redriver performance that otherwise can occur if only the first bias current 471 were used during CIO mode start-up. The same technique may be used for CTLE, PDR (or PGA if available) of the redriver for some applications.

The controller 450 may control the overall operation of the redriver and its attendant circuits during all modes of operation. In CIO mode, the controller 450 may generate the channel enable signal Channel-En input into the logic circuits 420, 430, and 440. In addition, the controller 450 may generate a signal for selecting the bias voltage to be applied to the pre-driver 494 and/or driver 498 of the transmitter circuit. In the present embodiment, the controller may generate one or more signals to control switches 478 and 479 respectively coupling application of the first and second bias currents to the transmitter circuit. In CIO mode, the controller 450 outputs a switch signal Fast_Bias_En to connects both switches 478 and 479 to output the second bias current (corresponding to a sum of first bias current 471 and boost current 472) to the transmitter circuit 490. In one or more other modes (e.g., normal mode), the controller 450 may output control signals to close switch 478 and open switch 479 to only apply the first bias current 471 to the transmitter circuit.

By boosting the bias current applied to the bias part of the transmitter circuit by boost current 472 and outputting the Channel-En signal (e.g., having a logical value of 1 when the logic gates are OR gates), the channel 500 of the redriver is powered on (e.g., the equalizer and transmitter circuits are activated and the transmitter circuit is biased) at a rate sufficient to satisfy the CIO mode time window. As previously indicated, channel 500 may correspond to a high-speed channel of a USB-C cable.

Figure 5:
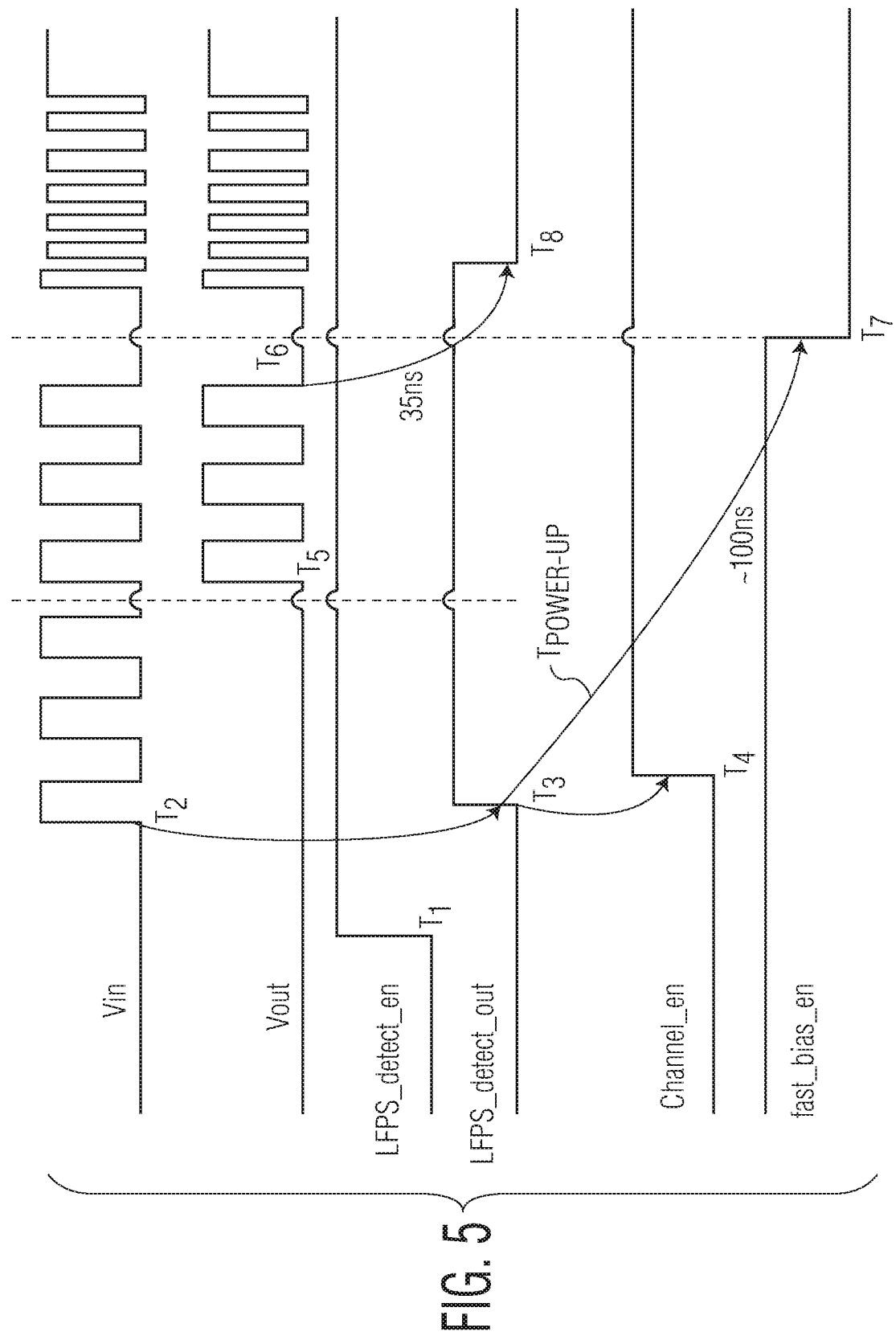
FIG. 5 illustrates an embodiment of a timing diagram for the redriver of FIG. 4.

FIG. 5 shows an embodiment of a timing diagram used to power on the channel 500 of the redriver in CIO mode. Referring to FIG. 5, the timing diagram includes waveforms for an input voltage Vin, an output voltage Vout, the enable signal (LFPS_Detect_En) of the signal detector 410, the output signal (LFPS_Detect_Out) of the signal detector 410, the channel enable signal (Channel_En), and the control signal (Fast_Bias_En) for controlling switch 479 to add the boost current 472 to the first bias current 471 to generate the second bias current for input into the transmitter circuit 490.

Referring to FIG. 5, at time $T_1$, the signal detector 410 is enabled based on signal LFPS_Detect_En, which, for example, may be received when the host system including the redriver is turned on or when control software in the host system or redriver is otherwise programmed to output the enable signal to the detector.

At time $T_2$, the signal detector 410 detects the first of a series of LFPS pulses received on the differential input line coupled to the receiver circuit.

At time $T_3$, which is less than the duration of one LFPS pulse (e.g., less than 20 nS for a 50 MHZ pulse) after time $T_2$, the signal detector 410 generates control signal LFPS_Detect_Out for output to the logic gates 420, 430, and 440 and controller 450. The control signal LFPS_Detect_Out may have a logical 1 value at this time. This value causes gates 420, 430, and 440 to output respective enable signals Enb to the equalizer circuit, the pre-driver and driver of the transmitter circuit, and a circuit for generating the first bias current 471 and boost current 472.

At time $T_4$, the controller 450 outputs the Channel_En signal to the logic gates 420, 430, and 440. However, because the LFPS_Detect_Out signal having a logical 1 was previously input into these logic gates and because the logic gates are OR gates, applying the Channel_En signal to logic gates 420, 430, and 440 has no operative effect at time $T_4$. When the value of the LFPS_Detect_Out signal transitions to a logical zero value, e.g., at time $T_8$, the Channel_En signal (having a logical value of 1) will keep the channel signals enabled through operational modes that occur after the CIO mode. The time $T_4$ may be, for example, approximately 10 to 20 ns after time $T_3$.

At time $T_5$, because all of the channel circuits have been enabled, the transmitter circuit begins outputting LFPS pulses. In one embodiment, because the output of the signal generator controls generation of the enable signals independently from controller 450, the LFPS signals output on the output line Vout may occurs as soon as three pulses from the time $T_2$ the receiver circuit received the first LFPS pulse.

At time $T_6$, after six LFPS pulses have been received by the receiver circuit (and three LFPS pulses have been output to line Vout), the controller 450 responds to the LFPS_Detect_Out control signal received from the signal detector 410 by changing the logical value of signal Fast_Bias_En used to control switch 479, at time $T_1$. The state of this signal turns switch 479 off to prevent the boost voltage 472 from continuing to be applied. This causes the second bias current (equal to a sum of the first bias current 471 and the boost current 472) to be replaced with just the first bias current 471. In some cases, signal Fast_Bias_En may be used as a basis for controlling the state of both switches 478 and 479, or separate control signals may be output from the controller 450 to control respective ones of the switches.

In one embodiment, the logical value of signal Fast_Bias_En may be turned on at a time even before time $T_1$. This may be accomplished, for example, by the controller 450 setting the logical value of signal Fast_Bias_En to have a default or initial value that closes switch 479. The switch 478 may have a default setting of on or may be controlled to a different state as determined, for example, by the controller.

At time $T_7$, when the signal Fast_Bias_En transitions to a value that disconnects the boost current from the bias input of the transmitter circuit, the channel may be considered to be in a powered-on state; in other words, the channel circuits have been activated and are now ready to transmit data and/or other information in non-CIO mode. Thus, at this time, the redriver may switch from CIO mode to normal mode (or another mode as determined, for example, by the controller). The signal quality of the LFPS signal will be almost untouched during the transition of the Fast_Bias_En at time $T_7$.

The length of time $T_{power-up}$ between $T_3$ (when the output of the signal detector 410 enables the channel circuits) and the time $T_7$ (when the transmitter circuits have been biased at the increased rate proportional to the boost voltage 172), and thus the time when the channel is considered to be powered-up, is approximately 100 ns or less. A period of 100 ns or less to power-up the channel is well within the time window for power-up corresponding to the CIO mode specification.

At time $T_8$, the signal detector 410 stops detecting LFPS signals. This may take place within a very short period of time (e.g., 35 ns) after time $T_6$, when the last LFPS signal is output from the transmitter circuit. Altogether, in this example, power-up of the channel based on receiving only six LFPS pulses and outputting the first three of those pulses.

The embodiments described here are able to meet at least the following requirements of CIO mode: 1) the control logic of the disclosed embodiments do not affect high-speed performance of the redriver, 2) the control logic satisfies the shortened time window for fast high-speed channel response in Lower Power status, 3) the control logic will not modify the core design of the high-speed channel, but just adds some features for implementing the fast bias approach described herein, which, in turn, reduces channel start up time in CIO mode, 3) the control logic satisfies 3 cycles of LFPS response time from the disabled high-speed channel and tPreData time<20 nS for CIO (USB4.0) and USB3.x applications, and 4) the control logic satisfies other high-speed channel performance requirements.

Figure 6:
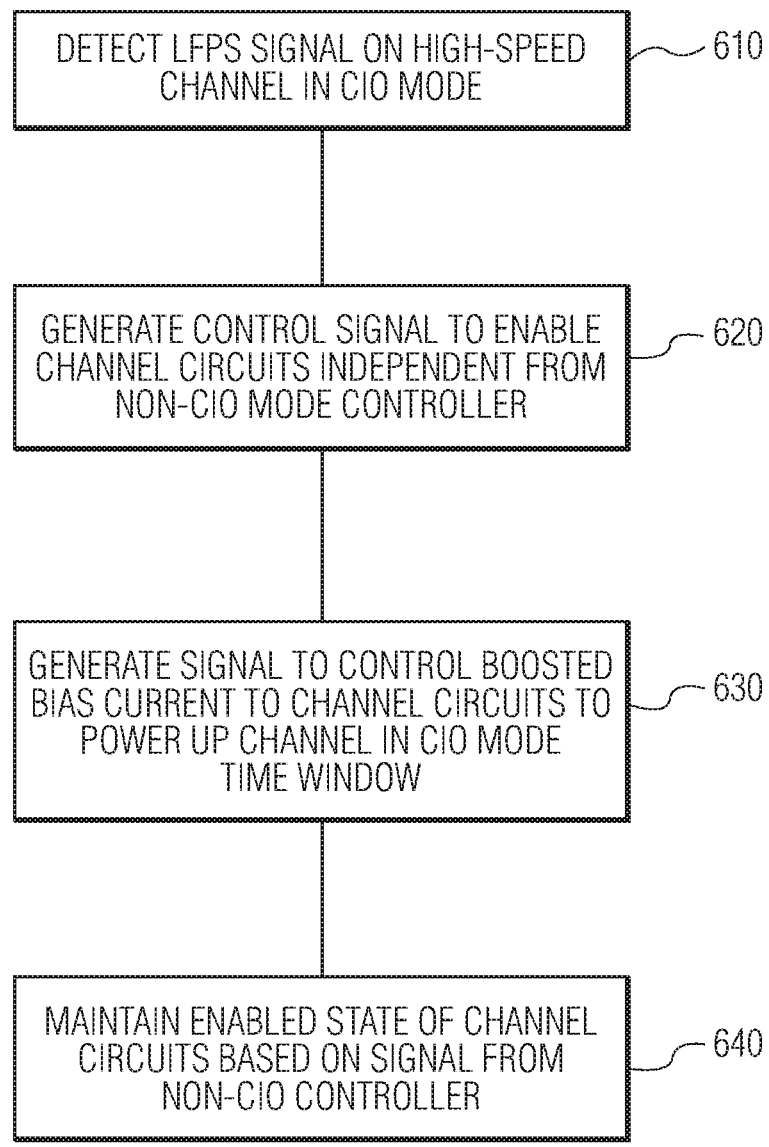
FIG. 6 illustrates an embodiment of a method for controlling power-up of a redriver in CIO mode.

FIG. 6 illustrates a method for powering up the channel of a redriver in order to satisfy the requirements of a CIO mode. The redriver may be one corresponding to FIG. 4 with control logic for implementing the timing diagram of FIG. 5. The channel may be a high-speed channel compatible with a USB-C or other protocol.

In operation 610, the method includes detecting a signal on the channel of the redriver in CIO mode. The signal may be detected using the signal (e.g., squelch) detector 410 previously described, and the signal may include a series of LFPS pulses received on the differential input line Vin.

In operation 620, a control signal (LFPS_Detect_Out) is generated to enable the channel circuits in the redriver. This control signal may be output from the signal detector and may also be used to enable a circuit to generate two bias voltages, namely the first bias current 271 and the boost bias voltage 272. Thus, the channel circuits and circuit for generating bias voltages are enabled independent from a controller used to control operation of the channel circuits during a non-CIO mode of operation. The channel circuits may include the equalizer and transmitter circuits previously discussed. A channel enable (Channel_En) signal may also be output to the channel circuits based on the control signal output from the signal detector. The channel enable signal may be output from the controller 450 of the control logic.

In operation 630, a control signal (Fast_Bias_En) is used to apply a second bias current to the bias control of the transmitter circuits. The second bias current is based on the sum of a first bias current (e.g., used to bias the transmitter circuits in a non-CIO mode) and the boost current. The boost current increases the rate for powering up the channel, as previously explained.

In operation 640, control signal (Fast_Bias_En) is deasserted, channel enable (Channel_En) signal maintains the channel circuits in an enabled state, and the redriver transitions from the CIO mode to another mode of operation.

Figure 7:
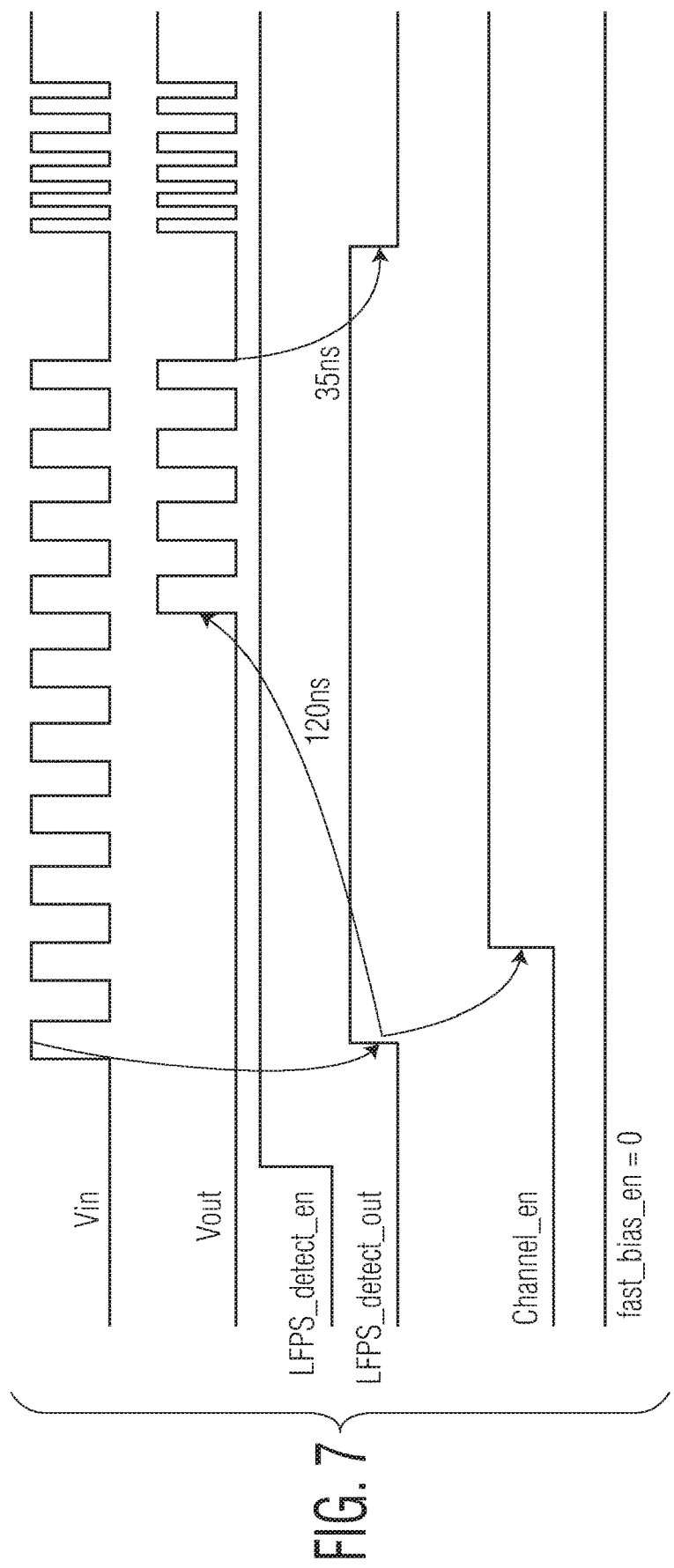
FIG. 7 illustrates an embodiment of a redriver operating in a normal (e.g., non-CIO) mode.

FIG. 7 illustrates an embodiment of a timing diagram for the redriver in other modes, e.g., modes different from CIO mode. In this timing diagram, values are given for the same signals in the timing diagram of FIG. 5.

Referring to FIG. 7, the Fast_Bias_En signal is turned off (e.g., at logical 0) during these other modes. Consequently, the switch 479 will be opened and the boost current will not be used for biasing the transmitter circuits. As a result, powering the high-speed channel 500 takes significantly longer (e.g., 120 ns) than the embodiment of FIG. 5. The timing diagram of FIG. 7 is supplied to show, by comparison, that without the early enable and boosted bias implemented by the control logic of FIGS. 4 and 5, the redriver will not be able to operate in a manner that satisfies CIO mode requirements.

In accordance with one or more embodiments, a redriver detects the orientation of a cable or other interface coupled to a host system, a device, or both. The redriver may perform this operation, for example, when the host system does not inform the redriver of the cable orientation within a predetermined time period. In this case, the redriver informs the host system of the cable orientation, thereby preventing a system malfunction or error condition. The host system may also turn off power to circuits that are not used to perform signaling based on the detected orientation of the cable. By detecting the cable orientation, the redriver is able to improve operation of the host system while reducing power consumption.

The controllers, detectors, control logic, or other signal processing or signal generating features of the embodiments disclosed herein may be implemented in logic which, for example, may include hardware, software, or both. When implemented at least partially in hardware, the controllers, detectors, control logic, and other signal processing and signal generating features may be, for example, any one of a variety of integrated circuits including but not limited to an application-specific integrated circuit, a field-programmable gate array, a combination of logic gates, a system-on-chip, a microprocessor, or another type of processing or control circuit.

When implemented at least partially in software, the controllers, detectors, control logic, and other signal processing and signal generating features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the embodiments may transform the computer, processor, controller, or other signal processing device into a special-purpose processor for performing the methods described herein.

Another embodiment may include a computer-readable medium, e.g., a non-transitory computer-readable medium, for storing the code or instructions described above. The computer-readable medium may be a volatile or non-volatile memory or other storage device, which may be removably or fixedly coupled to the computer, processor, controller, or other signal processing device which is to execute the code or instructions for performing the operations of the embodiments herein.

Although the various exemplary embodiments have been described in detail with particular reference to certain exemplary aspects thereof, it should be understood that the invention is capable of other example embodiments and its details are capable of modifications in various obvious respects. As is readily apparent to those skilled in the art, variations and modifications can be affected while remaining within the spirit and scope of the invention. Accordingly, the foregoing disclosure, description, and figures are for illustrative purposes only and do not in any way limit the invention, which is defined only by the claims.

We claim:

1. A redriver, comprising:
a signal detector for a channel; and
control logic having a fast activation mode configured to activate the channel within a first time window, and a slow activation mode configured to activate the channel within a second time window that is longer than the first time window;
wherein in the fast activation mode the control logic is configured to activate the channel by sending a first bias current to a first circuit of the channel in response to a signal detected by the signal detector,
wherein in the slow activation mode the control logic is configured to activate the channel by sending a second bias current to the first circuit of the channel in response to the signal detected by the signal detector;
wherein the first bias current is greater than the second bias current;
wherein the control logic is configured to:
disable application of the first bias current to the first circuit after the first time window; and
control application of the second bias current to the first circuit after the first time window.

2. The redriver of claim 1, wherein
the signal includes a plurality of low frequency periodic signaling (LFPS) pulses, and
the time window for activation of the channel is equal to or less than a duration of N output LFPS pulses.

3. The redriver of claim 2, wherein N≤3.

4. The redriver of claim 1, wherein
the control logic includes the signal detector, and the signal detector is configured to output a signal to control application of the first bias current independent from a controller that controls the second bias current to the first circuit.

5. The redriver of claim 1,
wherein the control logic is configured to output a signal to enable at least one second circuit of the channel within the first time window.

6. The redriver of claim 5,
wherein the at least one second circuit is selected from a group consisting of a receiver circuit, an equalizer circuit, and a pre-driver circuit.

7. The redriver of claim 5, wherein
the control logic includes the signal detector, and
the signal detector is configured to output the signal to enable the at least one second circuit of the channel independent from a controller configured to enable the at least one second circuit.

8. The redriver of claim 1, wherein the first circuit includes a transmitter driver circuit.

9. The redriver of claim 1, wherein the channel is a high-speed channel that conforms to USB-C protocol.

10. A method for controlling a redriver, comprising:
detecting a signal on a channel of the redriver; and
activating the channel within a first time window using a fast activation mode;
activating the channel within a second time window, that is longer than the first time window, using a slow activation mode;
wherein activating the channel using the fast activation mode includes sending a first bias current to a first circuit of the channel in response to the detected signal,
wherein activating the channel using the slow activation mode includes sending a second bias current to the first circuit of the channel in response to the detected signal; and
wherein the first bias current is greater than the second bias current;
disabling application of the first bias current to the first circuit after the first time window; and
controlling application of the second bias current to the first circuit after the first time window.

11. The method of claim 10, wherein
the signal includes a plurality of low frequency periodic signaling (LFPS) pulses, and
the time window for activation of the channel is equal to or less than a duration of N output LFPS pulses.

12. The method of claim 11, wherein $N \leq 3$.

13. The method of claim 10,
wherein controlling the first bias current includes controlling application of the first bias current independent from a controller that controls the second bias current to the first circuit.

14. The method of claim 10, further comprising:
enabling at least one second circuit of the channel within the first time window.

15. The method of claim 14,
wherein the at least one second circuit is selected from a group consisting of a receiver circuit, an equalizer circuit, and a pre-driver circuit.

16. The method of claim 14, wherein:
enabling the at least one second circuit of the channel independent from a controller configured to enable the at least one second circuit.

17. The method of claim 10,
wherein the first circuit includes a transmitter driver circuit.

18. The method of claim 10,
wherein the channel is a high-speed channel that conforms to USB-C protocol.

19. A redriver, comprising:
a signal detector for a channel; and
control logic having a fast activation mode configured to activate the channel within a first time window, and a slow activation mode configured to activate the channel within a second time window that is longer than the first time window;
wherein in the fast activation mode the control logic is configured to activate the channel by sending a first bias current to a first circuit of the channel in response to a signal detected by the signal detector,
wherein in the slow activation mode the control logic is configured to activate the channel by sending a second bias current to the first circuit of the channel in response to the signal detected by the signal detector;
wherein the first bias current is greater than the second bias current;
wherein the control logic includes the signal detector; and
wherein the signal detector is configured to output a signal to control application of the first bias current independent from a controller that controls the second bias current to the first circuit.

* * * * *